United States Patent
Xu et al.

(10) Patent No.: US 11,850,834 B2
(45) Date of Patent: Dec. 26, 2023

(54) HOT-PRESSING DEVICE AND PROCESS FOR ANISOTROPIC CONDUCTIVE FILM (ACF) BONDING STRUCTURE

(71) Applicant: JIANGSU TELILAN COATING TECHNOLOGY CO., LTD., Wuxi (CN)

(72) Inventors: Zhengliang Xu, Wuxi (CN); Liang Zheng, Wuxi (CN); Zheng Xu, Wuxi (CN)

(73) Assignee: JIANGSU TELILAN COATING TECHNOLOGY CO., LTD., Wuxi (CN)

( * ) Notice: Subject to any disclaimer, the term of this patent is extended or adjusted under 35 U.S.C. 154(b) by 51 days.

(21) Appl. No.: 18/010,212

(22) PCT Filed: Nov. 17, 2021

(86) PCT No.: PCT/CN2021/131081
§ 371 (c)(1),
(2) Date: Dec. 14, 2022

(87) PCT Pub. No.: WO2023/019774
PCT Pub. Date: Feb. 23, 2023

(65) Prior Publication Data
US 2023/0211593 A1    Jul. 6, 2023

(30) Foreign Application Priority Data

Aug. 17, 2021  (CN) .......................... 202110942238.6

(51) Int. Cl.
B32B 41/00   (2006.01)
B32B 37/10   (2006.01)
B32B 38/16   (2006.01)

(52) U.S. Cl.
CPC ............ B32B 37/10 (2013.01); B32B 38/162 (2013.01); B32B 41/00 (2013.01); *B32B 2457/202* (2013.01)

(58) Field of Classification Search
CPC ....... B32B 37/10; B32B 38/162; B32B 41/00; B32B 2457/202
(Continued)

(56) References Cited

U.S. PATENT DOCUMENTS

| 2001/0015495 | A1  | 8/2001 | Brofman et al. |
| 2008/0047663 | A1* | 2/2008 | Nam ...................... H05K 3/323 156/272.8 |
| 2016/0257107 | A1* | 9/2016 | Yamada ................ H05K 3/361 |

FOREIGN PATENT DOCUMENTS

| CN | 101995683 A | 3/2011 |
| CN | 204433780 U | 7/2015 |

(Continued)

*Primary Examiner* — Michael N Orlando
*Assistant Examiner* — Joshel Rivera
(74) *Attorney, Agent, or Firm* — Bayramoglu Law Offices LLC

(57) ABSTRACT

A hot-pressing device and process for an ACF bonding structure are provided. The hot-pressing device includes a transfer module and a first mounting plate connected to the transfer module. A negative-pressure adsorption module, at least one positioning module, and a lifting module are arranged on the first mounting plate. Pressing modules with hot-pressing assemblies are arranged at four corners close to the first mounting plate. Cleaning modules corresponding to the pressing modules are arranged in the transfer module below the first mounting plate. The present disclosure can quickly remove glue overflowing on a heat conduction element in the hot-pressing module by the cleaning module to ensure the surface flatness of a second part of the heat conduction element for hot-pressing and satisfactory resistance of an ACF connected to a substrate after hot-pressing.

16 Claims, 12 Drawing Sheets

(58) Field of Classification Search
USPC .................... 156/60, 64, 350, 351, 378, 379
See application file for complete search history.

(56) References Cited

FOREIGN PATENT DOCUMENTS

| | | | |
|---|---|---|---|
| CN | 204883102 | U | 12/2015 |
| CN | 205550924 | U | 9/2016 |
| CN | 106941763 | A | 7/2017 |
| CN | 109976004 | A | 7/2019 |
| CN | 209231639 | U | 8/2019 |
| CN | 111151481 | A | 5/2020 |
| CN | 111712124 | A | 9/2020 |
| CN | 211840862 | U | 11/2020 |
| CN | 212628618 | U | 2/2021 |
| CN | 112757018 | A | 5/2021 |
| CN | 113900292 | A | 1/2022 |
| JP | 2000263005 | A | 9/2000 |
| KR | 101965353 | B1 | 4/2019 |

\* cited by examiner

HOT-PRESSING DEVICE AND PROCESS FOR ANISOTROPIC CONDUCTIVE FILM (ACF) BONDING STRUCTURE

CROSS REFERENCE TO THE RELATED APPLICATIONS

This application is the national phase entry of International Application No. PCT/CN2021/131081, filed on Nov. 17, 2021, which is based upon and claims priority to Chinese Patent Application No. 2021113135897, filed on Aug. 17, 2021, the entire contents of which are incorporated herein by reference.

TECHNICAL FIELD

The present disclosure relates to the technical field of hot-pressing devices, in particular, to a hot-pressing device and process for an anisotropic conductive film (ACF) bonding structure.

BACKGROUND

Contact conductance is widely used for metal components of electronic products to achieve electromagnetic shielding. Generally, a contact conductance region is formed on the surface of the metal component through conductive adhesive tape. This solution is environmentally friendly, simple in manufacturing, and low in cost, but it has low electrical conductivity, poor thermal conductivity, and poor performance stability.

The ACF is composed of high-quality resin and conductive particles. It is mainly used in a process where there is no way to perform high-temperature lead-tin soldering on the electronic circuit board, that is, the conventional bonding process. The conventional bonding process involves the connection of a flexible circuit board or flexible cable to a liquid crystal display (LCD), the connection of a flexible circuit board or flexible cable to a printed circuit board (PCB), the connection of a flexible circuit board or flexible cable to a membrane switch, or the connection of a flexible circuit board to a flexible circuit board.

Usually, the ACF needs to be bonded with a metal film having a non-metallic coating, that is, the surface of a substrate. However, at present, the following problems are likely to occur when the ACF is subjected to heat-pressed curing.

1. The substrate easily shifts during production, which makes the ACF prone to positional defects and warping deformation during hot-pressed curing, thus leading to an increase in the rate of defective products.

2. When the punch performs hot-pressing, the melted glue easily overflows near the ACF. If the overflowing glue is attached to the punch, the punch cannot be kept stable during hot-pressing, resulting in the resistance of the ACF hot-pressed with the substrate unable to be guaranteed.

3. When the ACF and the metal structure are hot-pressed, stress concentration easily occurs, resulting in the distortion of the ACF and the substrate after hot-pressing.

SUMMARY

An objective of the present disclosure is to provide a hot-pressing device and process for an anisotropic conductive film (ACF) bonding structure to solve most, if not all, of the problems existing in the prior art.

To achieve the above objective, the present disclosure adopts the following technical solutions.

A hot-pressing device for an ACF bonding structure includes a transfer module and a first mounting plate connected to the transfer module. A negative-pressure adsorption module, at least one positioning module, and a lifting module are arranged on the first mounting plate. Pressing modules with hot-pressing assemblies are arranged at four corners close to the first mounting plate. Cleaning modules corresponding to the pressing modules are arranged in the transfer module below the first mounting plate.

The cleaning modules each include a first linear guide rail. One part of a movable end of the first linear guide rail is connected to a water storage base. The water storage base is provided with at least one water storage tank that is provided therein with a water-absorbing element. The water-absorbing element is provided below a non-woven fabric fixed by a pressure base. An abrasive element close to one side of the pressure base is provided at a movable end of a second linear guide rail. The second linear guide rail is provided at the other part of the movable end of the first linear guide rail. The movable end of the second linear guide rail is further provided with a valve mounting plate. The valve mounting plate is provided with a suction hole that is connected to a suction valve.

Further, the negative-pressure adsorption module is configured to adsorb a substrate and includes an adsorption plate and multiple vacuum adsorption holes arranged in the adsorption plate. The vacuum adsorption holes are connected to a vacuum generating device through a vacuum channel, and each include a first hole and a second hole communicated with the first hole. The diameter of the first hole decreases towards the surface of the adsorption plate. The first hole is provided therein with an airflow tube, which has one end connected to the wall of the second hole through at least two elastic elements and the other end connected to a spacer. The spacer has a vortex hole.

Further, the transfer module includes a first moving plate connected to the first mounting plate. The first moving plate is connected to one part of a third linear guide rail, and the other part of the third linear guide rail is connected to a bottom plate. The first moving plate is further connected to an output end of a first driving element through a first transmission mechanism.

Further, the lifting module includes a first cylinder body and a first piston connecting plate connected to the first cylinder body. The first piston connecting plate is connected to one part of a fourth linear guide rail, the other part of the fourth linear guide rail is provided in the first cylinder body. The outer side of the first piston connecting plate is connected to a pressing plate mounting plate that is connected to a pressing plate.

Further, the positioning module includes a second cylinder body. The output end of the second cylinder body is connected to one part of a fifth linear guide rail, the other part of the fifth linear guide rail is provided in the second cylinder body. The one part of the fifth linear guide rail is further connected to a positioning plate.

Further, the pressing modules each include a second driving element, an output end of which is connected to a second moving plate through a second transmission mechanism. The bottom of the second moving plate is connected to a sixth linear guide rail. The second moving plate is provided with a third driving element and a linear module connected to an output end of the third driving element. The linear module is provided with a fixing plate that is connected to a second mounting plate. The second mounting plate is provided with a seventh linear guide rail and a third moving plate that is connected to one part of the seventh linear guide rail. One part of a transition plate is connected to the third moving plate. The transition plate has one end connected to a fourth driving element through a floating joint and the other end connected to one part of a leveling assembly through a punch. The other part of the leveling assembly is connected to the hot-pressing assembly.

Further, the hot-pressing assembly includes a heat insulation part with an opening. The opening of the heat insulation part is closed by a heat conduction element. An enclosed space is formed between the inner side of the heat insulation part and the inner side of the heat conduction element, in which a heating element is provided. The heating element is provided therein with at least one heating tube. The heating tube has one part connected to the heat insulation part and the other part connected to the heating element. The interior of the heating tube is further connected to a thermocouple. A thermal conductive silica gel film is provided at a connection between the heating element and the heat conduction element.

Further, the heat conduction element includes a first part and a second part integrally connected to the first part. The second part protrudes outward from a side of the first part. The surface of the second part is provided with at least one groove, which includes a first notch and a second notch. The first notch has a width larger than the width of the second notch. A tapered transition port is provided between the first notch and the second notch.

Correspondingly, the present disclosure further provides a hot-pressing process by the hot-pressing device for an ACF bonding structure, which includes the following steps.
- positioning, by at least two positioning modules, the negative-pressure adsorption module;
- adsorbing, by the negative-pressure adsorption module, the substrate;
- locally covering, by the lifting module, a surface of the substrate with the pressing plate;
- moving at least one pressing module and lowering the hot-pressing assembly to the surface of the substrate to hot-press the ACF;
- resetting the hot-pressing assembly; and moving, by the transfer module, the negative-pressure adsorption module, the substrate, the positioning module, and the lifting module away from the pressing module through the first mounting plate; and
- raising the cleaning module; controlling, by the pressing module, at least one part of the hot-pressing assembly to rub with an abrasive part of the cleaning module at least 5 times, 1-5 s each time;
- controlling, by the pressing module, the hot-pressing assembly to move to a wet part of the cleaning module, such that the one part of the hot-pressing assembly is wetted at least 5 times, 2-5 s each time; and
- controlling, by the pressing module, the one part of the hot-pressing assembly to rub with the abrasive part of the cleaning module at least 2 times.

Further, alternatively, the ACF is replaced with a thermosetting composite conductive film.

Compared with the prior art, the present disclosure has the following beneficial effects.

(1) The present disclosure can quickly remove glue overflowing on the heat conduction element in the hot-pressing module by the cleaning module to ensure the surface flatness of the second part of the heat conduction element for hot-pressing and ensure satisfactory resistance of the ACF connected to the substrate after hot-pressing. The present disclosure realizes a highly automatic cleaning process, which saves labor and time, reduces labor costs, and avoids problems caused by traditional manual cleaning.

(2) The present disclosure ensures the reference positioning of the negative-pressure adsorption module on the first mounting plate through the positioning module and ensures that the substrate is fully adhered to the surface of the adsorption plate to avoid its deviation during subsequent hot-pressing. The present disclosure also ensures that the bent part of the substrate has a low deformation during hot-pressing to avoid deformation during hot-pressing and affecting the product yield.

(3) Further, the leveling assembly is provided with the first balancing element and the second balancing element that ensure the flatness of the leveling mechanism in the left-right direction and the front-back direction. In this way, the flatness and parallelism of the pressing part of the hot-pressing assembly are consistent, and the stress on the surface of the ACF is balanced after contacting the hot-pressing assembly to avoid indentation during the hot-pressing process and effectively solve the problem of flatness variation of the bonding structure when the temperature changes from low to high.

(4) Further, the heating element has good high-temperature stability, and the heat insulation part further inhibits the upward heat conduction of the heating element and the heating tube, thus avoiding heat loss. The heat always flows downward and towards the heat conduction element, such that the heat of the heat conduction element is always kept within a reasonable range.

(5) Further, most part of the heating element is covered by the heating tube, which ensures the heat conduction performance of the heating element and the heating tube, such that heat can be quickly and stably transferred to the heat conduction element. The groove can also play the role of yielding and enabling point pressure contact for the bottom contact surface of the second part in the heat conduction element. In addition, the groove can further release local stress to avoid thermal stress deformation on the bonding structure during hot-pressing, thus improving the product yield.

(6) Further, since the airflow tube is made of a flexible material, the cone angle of the airflow tube is reduced when the airflow tube is pulled. Due to the reduction in the cone angle, a forward net force is generated on the suction flow. That is, the pressure in front of the airflow tube is less than the pressure behind. The work done by the pressure is converted into kinetic energy to ensure that the fluid is continuously accelerated, which increases the energy of the suction flow. The suction flow with increased energy passes through the vortex hole. Since the vortex hole is spiral, the suction flow with increased energy is converged there and a vacuum vortex is generated. The vacuum vortex flows out of the vortex hole and then passes through the first hole, thus increasing the kinetic energy. Therefore, the substrate is adsorbed by a stable adsorption force, and the adsorption force will not damage the substrate, thus prolonging the service life of the substrate without causing an adsorption mark on the surface of the substrate.

(7) Further, the groove has the first notch and the second notch connected to the first notch, and the tapered transition port is provided between the first notch and the second notch. The width of the first notch is greater than that of the second notch. Through the first notch with a larger width, local normal-temperature gas below the temperature of the heat conduction element collects at the first notch during downward hot-pressing. During further downward hot-pressing, the gas is accelerated at the tapered transition port and enters the second notch. The second notch with a smaller width contributes to the largest gas flow and the lowest temperature. In this way, the gas is further cooled as a cooling gas to impact the surface of the part to be hot-pressed. It generates heat exchange with the surface of the part to be hot-pressed to generate a temperature gradient, further releasing local stress and avoiding thermal stress deformation on the bonding structure during hot-pressing, thus improving the product yield.

Figure 1:
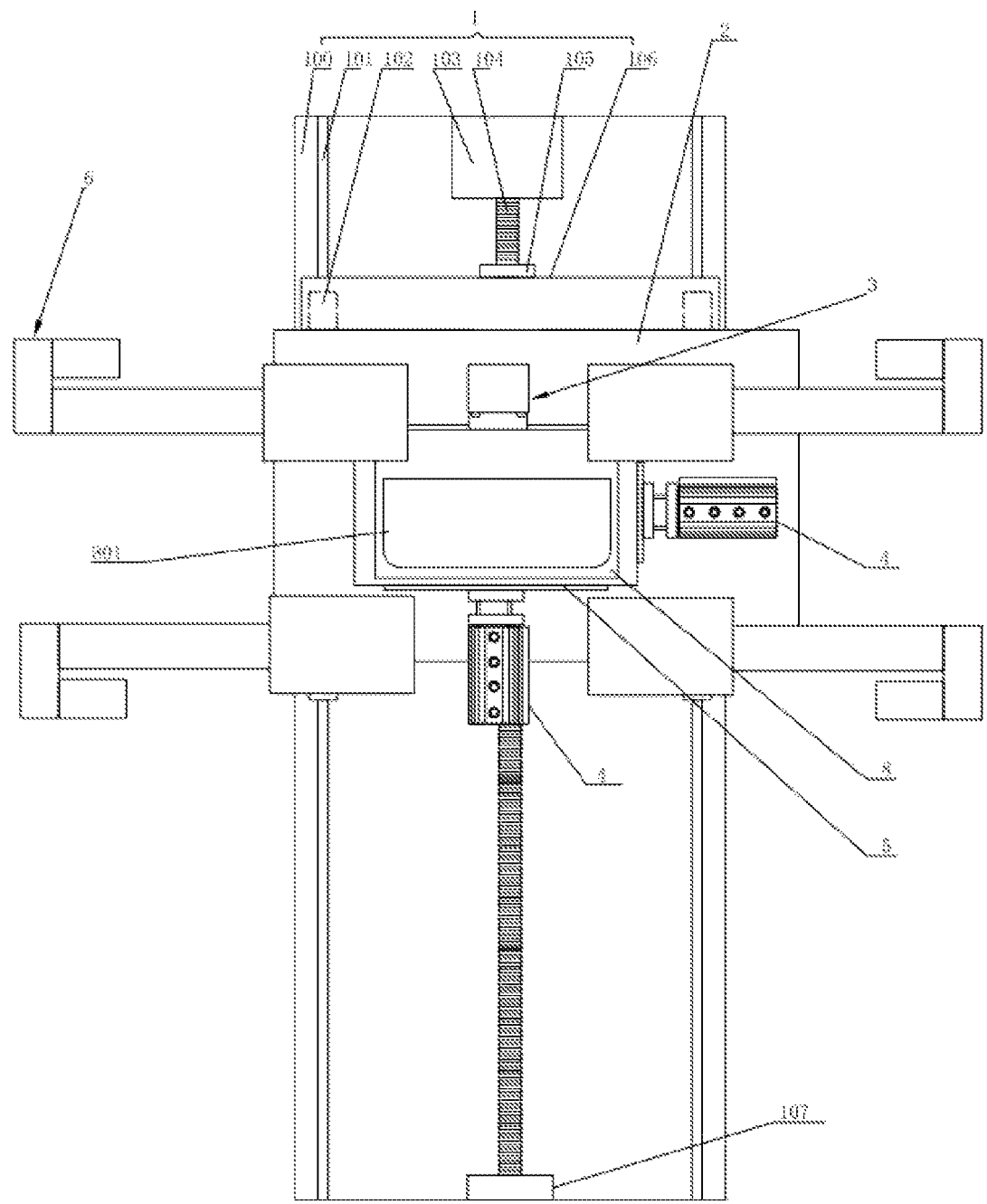
FIG. 1 is a structural diagram of a hot-pressing device for an ACF bonding structure according to an embodiment of the present disclosure.

Reference Numerals: 1. transfer module; 100. bottom plate; 101. third guide rail; 102. third slider; 103. first driving element; 104. first screw rod; 105. first nut; 106. first moving plate; 107. screw rod mounting plate; 2. first mounting plate; 3. lifting module; 300. third cylinder body; 301. fourth guide rail; 302. fourth slider; 303. third piston; 304. third piston connecting plate; 305. pressing plate mounting plate; 4. positioning module; 400. fourth cylinder body; 401. fifth guide rail; 402. fifth slider; 403. fourth piston; 404. fourth piston mounting plate; 405. positioning plate; 5. negative-pressure adsorption module; 501. adsorption plate; 502. vacuum adsorption hole; 5021. first hole; 50211. spacer; 50212. vortex hole; 50213. elastic element; 50210. airflow tube; 5022. second hole; 503. vacuum channel; 504. vacuum generating device; 6. pressing module; 600. second driving element; 601. sixth guide rail; 602. sixth slider; 603. second nut; 604. second moving plate; 605. third driving element; 606. linear module; 607. fixing plate; 608. second mounting plate; 609. seventh guide rail; 610. seventh slider; 611. fourth driving element; 612. floating joint; 613. transition plate; 614. punch; 615. second screw rod; 616. third moving plate; 7. cleaning module; 700. first cylinder body; 701. first guide rail; 702. first piston; 703. first piston connecting plate; 704. first slider; 705. second cylinder body; 706. second guide rail; 707. second slider; 708. second piston; 709. second piston connecting plate; 710. suction valve; 711. valve mounting plate; 712. suction hole; 713. sandpaper; 714. pressure base; 715. non-woven fabric; 716. sponge; 717. water volume monitor; 718. replenishing channel; 719. replenishing container; 720. water storage base; 721. limit sensor; 8. pressing plate; 801. opening; 9. substrate; 10. leveling assembly; 1000. first plate; 1001. second plate; 1002. third plate; 1003. first shaft; 1004. second shaft; 1100. heat conduction element; 11001. first part; 11002. second part; 1101. groove; 11011. first notch; 11012. second notch; 11013. transition port; 1102. first heat insulation element; 1103. second heat insulation element; 1104. third heat insulation element; 1105. heating element; 1106. heating tube; 1107. thermal conductive silica gel film; 11061. first tube; 11062. second tube; and 1108. thermocouple.

DETAILED DESCRIPTION OF THE EMBODIMENTS

To make the objectives, technical solutions, and advantages of the present disclosure clearer, the hot-pressing device and process for an anisotropic conductive film (ACF) bonding structure provided by the present disclosure are described in further detail below with reference to the drawings and specific implementations. The advantages and features of the present disclosure will become more apparent from the following descriptions. It should be noted that the drawings are simplified and do not use an accurate proportion, that is, the drawings are only intended to conveniently and clearly assist in illustrating the implementations of the present disclosure. To make the objectives, features, and advantages of the present disclosure clearer, the specific implementations of the present disclosure are described in detail below with reference to the drawings. The structure, scale, size, and the like shown in the drawings of this specification are only used to match the content disclosed in the specification and for those skilled in the art to understand and read and not used to limit the implementations of the present disclosure, and thus, are not technically substantial. Any structural modification, scaling relation change, or size adjustment made without affecting the effects and objectives that can be achieved by the present disclosure should fall within the scope that can be encompassed by the technical content disclosed in the present disclosure.

Referring to FIG. 1, the present disclosure provides a hot-pressing device for an ACF bonding structure. The hot-pressing device includes transfer module 1 and first mounting plate 2 connected to the transfer module 1. A negative-pressure adsorption module, at least one positioning module 4, and lifting module 3 are arranged on the first mounting plate 2. Pressing modules 6 with hot-pressing assemblies are arranged at four corners close to the first mounting plate 2. Cleaning modules 7 corresponding to the pressing modules 6 are arranged in the transfer module 1 below the first mounting plate 2.

The specific structure of the cleaning modules 7 is described in detail below.

Figure 3:
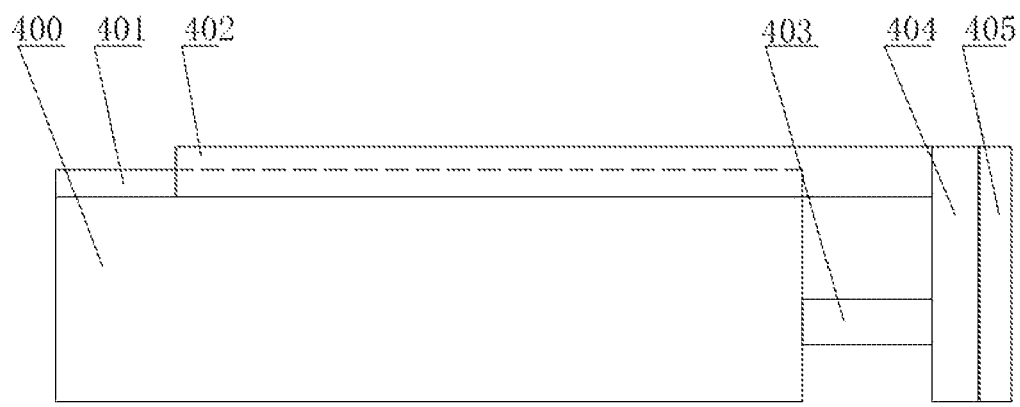
FIG. 3 is a schematic diagram of an operation of the positioning module of the hot-pressing device for an ACF bonding structure according to an embodiment of the present disclosure.
Figure 4:
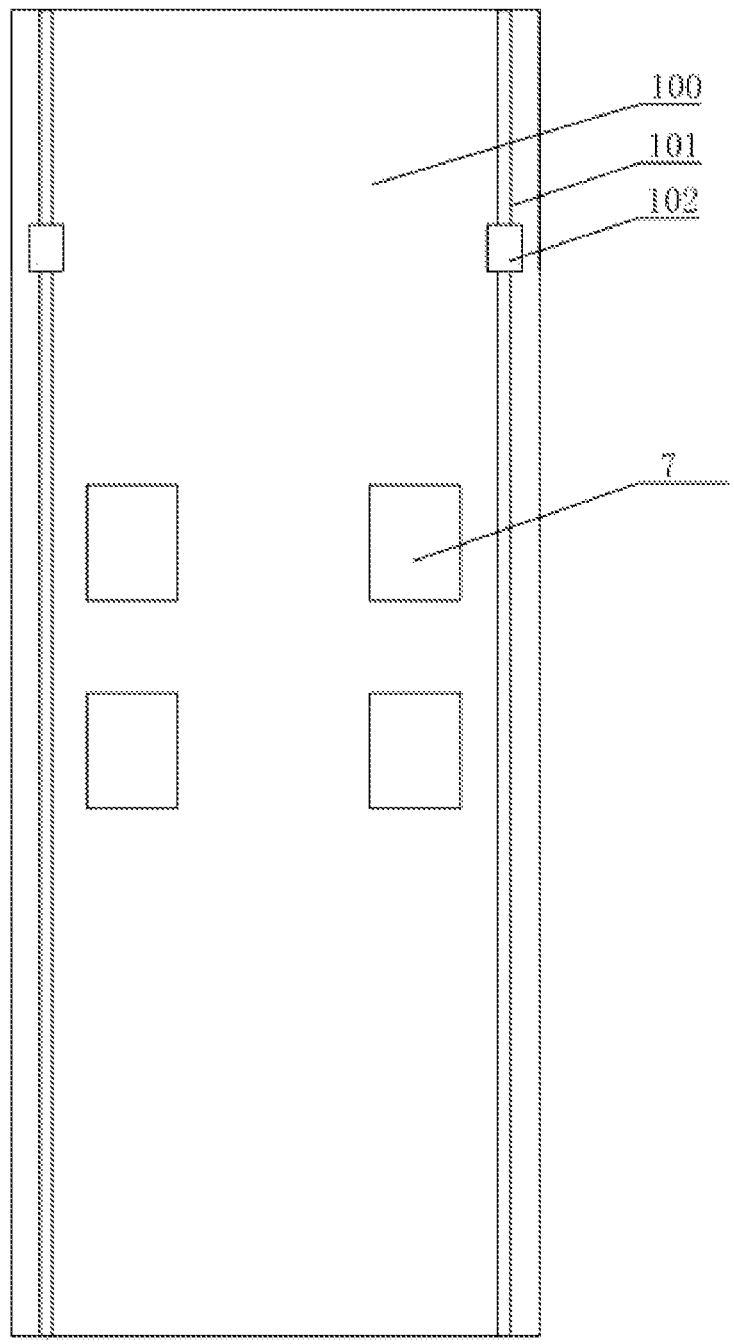
FIG. 4 is a partial structural diagram of a transfer module of the hot-pressing device for an ACF bonding structure according to an embodiment of the present disclosure.
Figure 9:
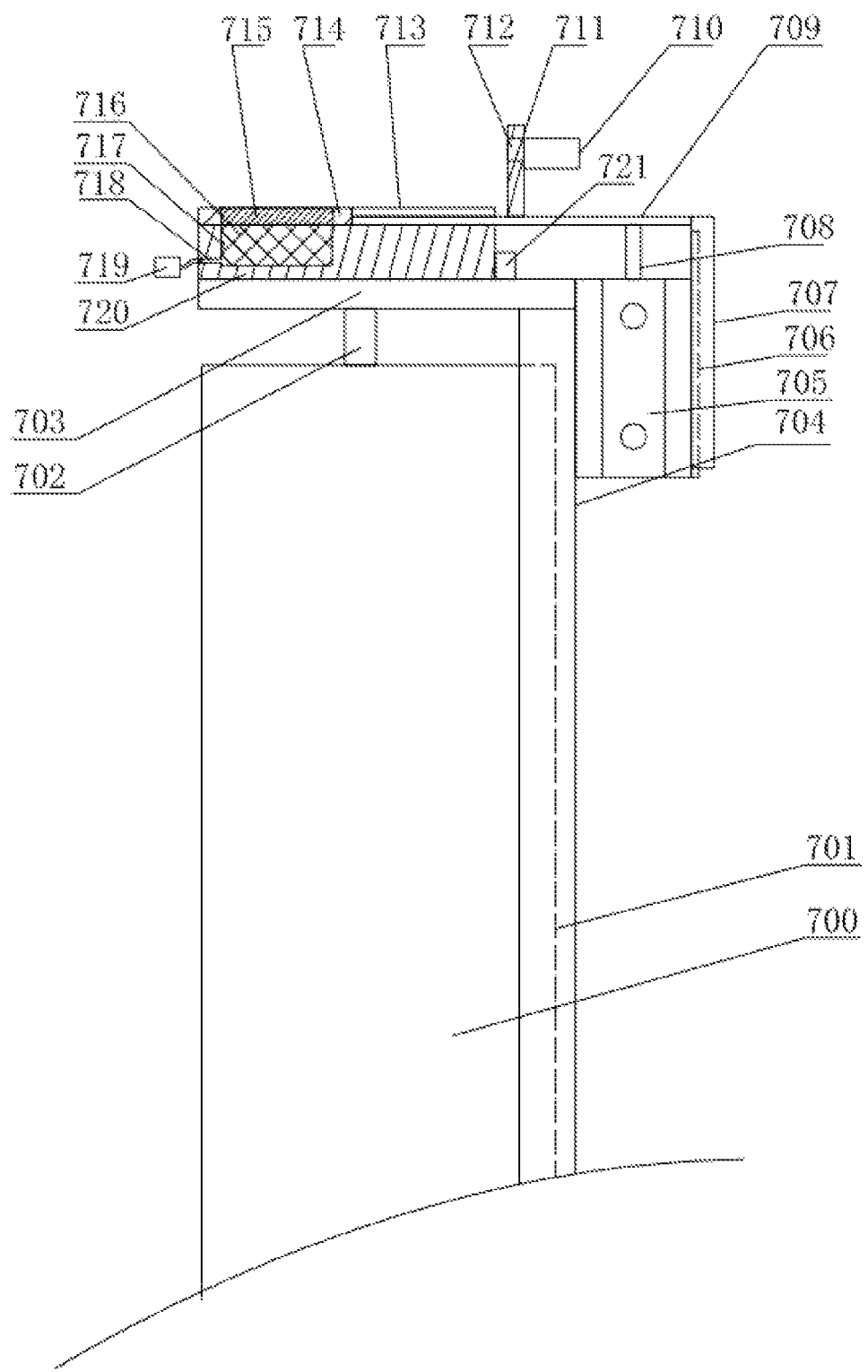
FIG. 9 is a structural diagram of a cleaning module of the hot-pressing device for an ACF bonding structure according to an embodiment of the present disclosure.
Figure 10:
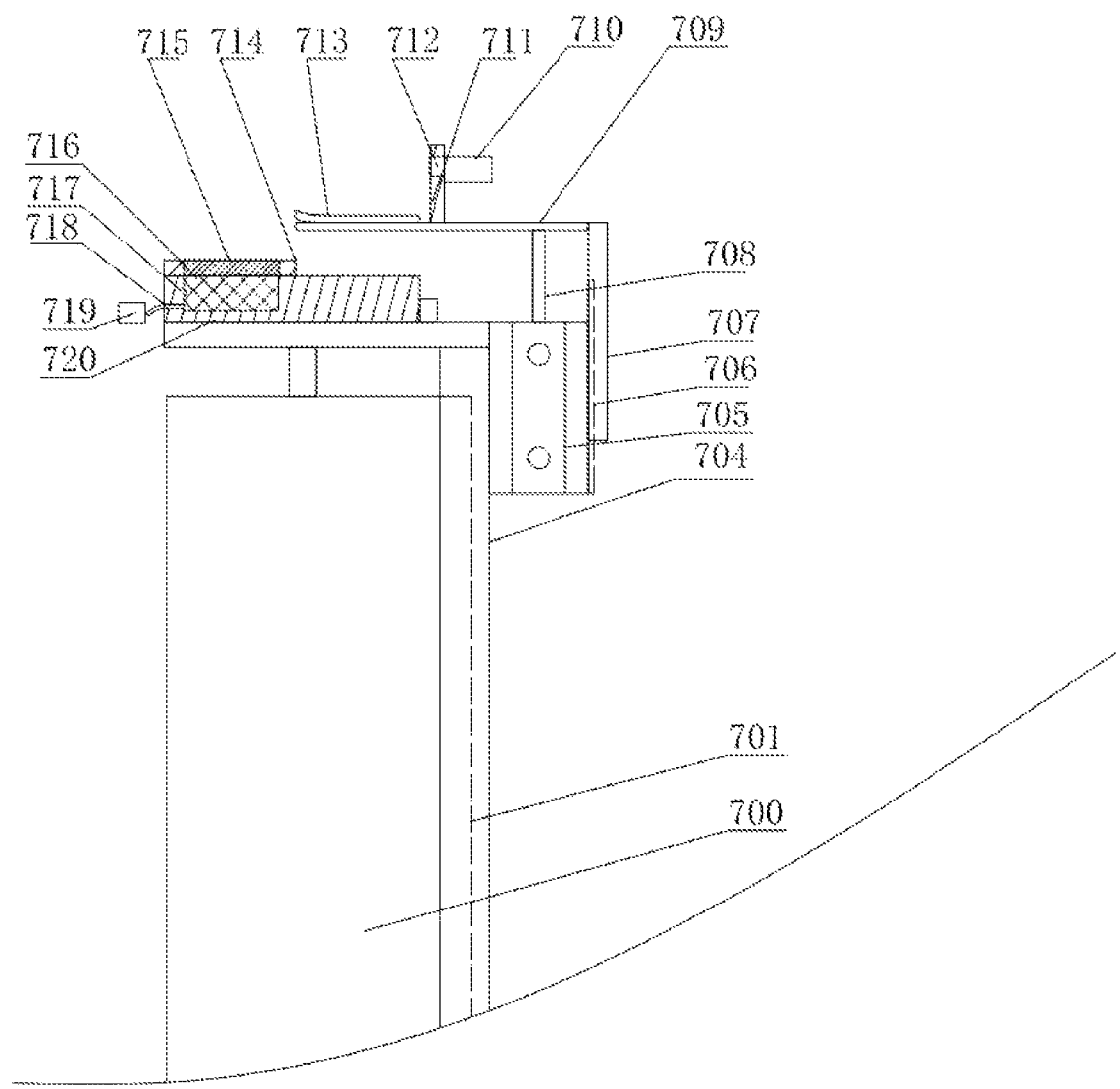
FIG. 10 is a schematic diagram of an operation of the cleaning module of the hot-pressing device for an ACF bonding structure according to an embodiment of the present disclosure.

Referring to FIGS. 3, 9, and 10, bottom plate 100 of the transfer module 1 has four openings, each of which is provided with the cleaning module 7. In the present disclosure, the number of the cleaning modules 7 includes, but is not limited to, 4. The cleaning module in the transfer module 1 can stretch out to clean the corresponding pressing module after the lifting module 3 and the positioning module 4 are moved out.

Specifically, referring to FIGS. 3, 9, and 10, the cleaning module includes a first linear guide rail. The first linear guide rail includes first cylinder body 700. An output end of the first cylinder body 700 is provided with first piston 702. The first piston 702 is connected to first piston connecting plate 703. One side of the first piston connecting plate 703 is connected to first slider 704. The first slider 704 is slidably connected to first guide rail 701.

Further, referring to FIGS. 9 and 10, the surface of the first piston connecting plate 703 is provided with water storage base 720. The water storage base 720 is provided with at least one water storage tank (not marked in the figure), and a water-absorbing element is provided in the water storage tank. Preferably, in the embodiment of the present disclosure, the water-absorbing element of the hot-pressing device is sponge 716, and a sponge body of the sponge 716 absorbs and fills with water. To avoid the loss of water in the sponge 716 due to evaporation, a replenishing channel 718 is further provided on the water storage base 720. The replenishing channel 718 has one end connected to the water storage tank and the other end connected to replenishing container 719 through a water pipe. When the water in the water storage tank is diminished due to evaporation, the water replenished by the water replenishing container 719 is filled into the water storage tank through the water pipe.

Further, referring to FIGS. 9 and 10, to fully monitor the water in the sponge 716, water volume monitor 717 is further provided on a side wall of the water storage tank. The water volume monitor 717 detects the amount of water that fills the sponge 716 in real-time to keep the sponge 716 in a filled state at all times.

Further, referring to FIGS. 9 and 10, non-woven fabric 715 is provided above the sponge 716. The non-woven fabric 715 is configured to absorb the water from the sponge 716 to keep a wet state. When a heat conduction element 1100 in the hot-pressing assembly contacts the non-woven fabric 715, the surface of the heat conduction element 1100 is wetted to facilitate the removal of glue overflow on the surface of the heat conduction element 1100. To ensure the fixation of the non-woven fabric 715, the non-woven fabric 715 is fixed by pressure base 714. The pressure base 714 has one part opened to expose one part of the non-woven fabric 715 and the other part pressing the other part of the non-woven fabric 715 and fixedly connected to the surface of the water storage base 720 through a fastener.

Further, referring to FIGS. 9 and 10, the cleaning module further includes an abrasive element, which is preferably sandpaper 713. The sandpaper 713 is detachably provided on second piston connecting plate 709. Preferably, in the hot-pressing device, the sandpaper 713 is attached to the surface of the second piston connecting plate 709 in the form of a velcro. The second piston connecting plate 709 has one part connected to second cylinder body 705 through second piston 708 and the other part connected to second slider 707. The second slider 707 is slidably connected to second guide rail 706 provided on the surface of the second cylinder body 705. The second cylinder body 705 drives the second piston 708 to extend and drive the second slider 707 to slide along the second guide rail 706, such that the sandpaper 713 and the second piston connecting plate 709 are raised or dropped. When the sandpaper 713 is raised through the second piston connecting plate 709, the sandpaper 713 can be manually torn off for replacement.

Further, referring to FIGS. 9 and 10, to stop the second piston connecting plate 709 from descending after it contacts the water storage base 720, limit sensor 721 is further provided on a side of the water storage base 720. The limit sensor 721 monitors the moving distance of the second piston connecting plate 709 to control the second piston connecting plate 709 to stop after contacting the water storage base 720.

Further, referring to FIGS. 9 and 10, to prevent dust and other small impurities from adhering to the heat conduction element 1100 of the hot-pressing assembly after cleaning, the second piston connecting plate 709 is further connected to valve mounting plate 711. The valve mounting plate 711 is provided with suction hole 712. The suction hole 712 is communicated with suction valve 710. When the suction valve 710 is opened, the suction hole 712 is aligned with the surface of the heat conduction element 1100 to absorb dust and other impurities adhered. The design ensures the surface cleanliness of the heat conduction element 1100, thereby improving the hot-pressing quality.

Referring to FIGS. 1 and 3, the specific structure of the transfer module 1 is described below.

The transfer module 1 is configured to control the movement of the lifting module 3 and each of the positioning modules 4. The transfer module 1 includes bottom plate 100. The bottom plate 100 is provided with a pair of third guide rails 101. The third guide rails 101 are respectively connected to third sliders 102. The third sliders 102 are connected through first moving plate 106. The bottom of the first moving plate 106 is further connected to first nut 105. The first nut 105 is threaded onto first screw rod 104. The first screw rod 104 has one end connected to screw rod mounting plate 107 fixed on the bottom plate 100 and the other end connected to first driving element 103. Preferably, the first driving element 103 is a motor.

Figure 11:
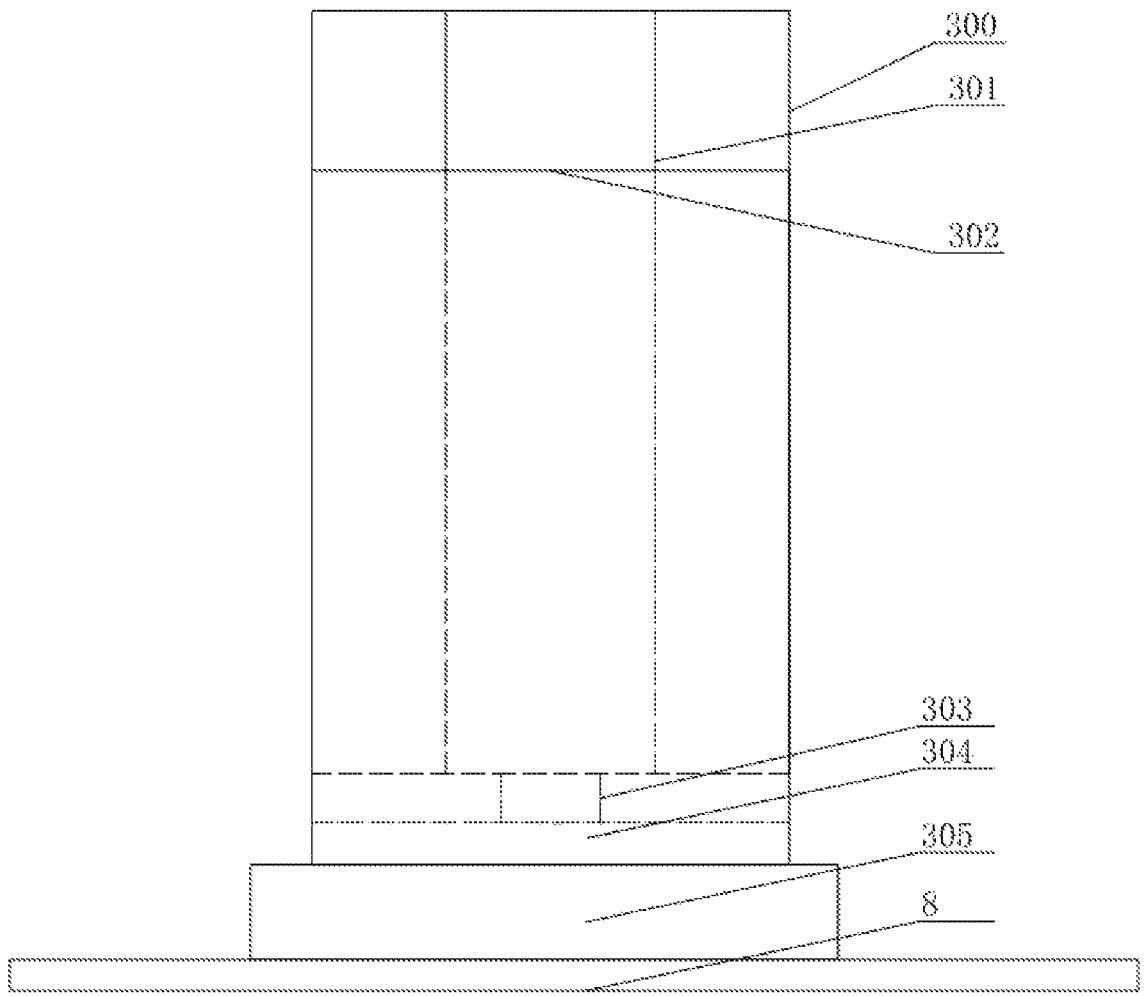
FIG. 11 is a structural diagram of a lifting module of the hot-pressing device for an ACF bonding structure according to an embodiment of the present disclosure.

Referring to FIGS. 1 and 11, the specific structure of the lifting module 3 is described below.

The lifting module 3 is configured to cover pressing plate 8 on a surface of a substrate with an ACF to further fix the position of the substrate. The pressing plate 8 is provided with opening 801 for the pressing module to perform hot-pressing.

Specifically, in the embodiment of the present disclosure, the substrate in the hot-pressing device refers to a metal film with a non-metallic coating. Correspondingly, in other embodiments of the present disclosure, the substrate can also be any one of a metal film or a metal component with a non-metallic coating.

Specifically, referring to FIGS. 1 and 11, the lifting module 3 includes third cylinder body 300. The output end of the third cylinder body 300 is provided with third piston 303. The third piston 303 is connected to third piston connecting plate 304. The third piston connecting plate 304 is connected to fourth slider 302. The fourth slider 302 is slidably connected to fourth guide rail 301 provided on the surface of the third cylinder body 300. The outer side of the third piston connecting plate 304 is further connected to pressing plate mounting plate 305. The pressing plate mounting plate 305 is connected to the pressing plate 8.

Figure 2:
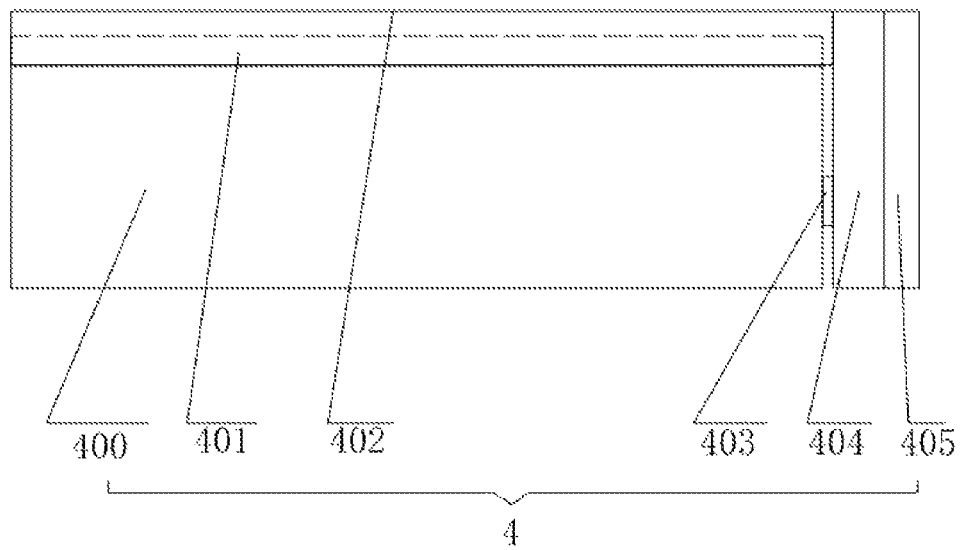
FIG. 2 is a structural diagram of a positioning module of the hot-pressing device for an ACF bonding structure according to an embodiment of the present disclosure.

Referring to FIGS. 1, 2, and 3, the specific structure of the positioning module 4 is described below.

The positioning module 4 is configured to position the negative-pressure adsorption module such that the negative-pressure adsorption module 5 is placed in the desired station at a predetermined position. In the embodiment of the present disclosure, the hot-pressing device includes two positioning modules 4, which are respectively arranged on two sides of the negative-pressure adsorption module 5.

The positioning module 4 includes fourth cylinder body 400. The fourth cylinder body 400 has fourth piston 403. The fourth piston 403 is connected to fourth piston mounting plate 404. The inner side of the fourth piston mounting plate 404 is connected to fifth slider 402. The fifth slider 402 is slidably connected to fifth guide rail 401 provided on the fourth cylinder body 400. The outer side of the fourth piston mounting plate 404 is further connected to the positioning plate 405.

Referring to FIGS. 1, 5, 6, 7, and 8, the specific structure of the negative-pressure adsorption module 5 is described below.

The negative-pressure adsorption module 5 is configured to adsorb the substrate 9. The negative-pressure adsorption module 5 includes adsorption plate 501. The adsorption plate 501 is preferably a rectangular plate. The surface of the adsorption plate 501 is provided with multiple vacuum adsorption holes 502 arranged in an array. The vacuum adsorption holes 502 are connected to vacuum generating device 504 through vacuum channel 503. The vacuum generating device 504 is preferably a vacuum generator, which offers an adsorption force for the vacuum adsorption holes 502 through the vacuum channel 503 to adsorb the substrate 9.

The vacuum adsorption holes 502 each are composed of first hole 5021 and second hole 5022 communicated with the first hole 5021. The second hole 5022 is communicated with the vacuum channel 503. The diameter of the first hole 5021 decreases towards the surface of the adsorption plate 501, such that the first hole 5021 is formed into a tapered hole with a small top diameter and a large bottom diameter. The first hole 5021 is further provided therein with airflow tube 50210. The airflow tube 50210 is made of a flexible material. One end of the airflow tube 50210 is connected to a wall of the second hole 5022 through at least two elastic elements 50213. The elastic element 50213 may preferably be a tension spring. The other end of the airflow tube 50210 is connected to spacer 50211. The spacer 50211 is made of a compressible material. The spacer 50211 has vortex hole 50212.

Further, referring to FIGS. 1, 5, 6, 7, and 8, the airflow tube 50210 is a tapered tube with a small top diameter and a large bottom diameter. Through the setting of the airflow tube 50210, when the vacuum generating device 504 is working, a suction flow generated by the vacuum generating device 504 enters the second hole 5022. Since the airflow tube 50210 is connected to the wall of the second hole 5022 through the tension spring, the suction flow continuously pulls the airflow tube 50210 into the second hole 5022. Since the airflow tube 50210 is made of a flexible material, the cone angle of the airflow tube is reduced when the airflow tube 50210 is pulled. Due to the reduction in the cone angle, a forward net force is generated on the suction flow. That is, the pressure in front of the airflow tube is less than the pressure behind. The work done by the pressure is converted into kinetic energy to ensure that the fluid is continuously accelerated, which increases the energy of the suction flow. The suction flow with increased energy passes through the vortex hole 50212. Since the vortex hole 50212 is spiral, the suction flow with increased energy is converged there and a vacuum vortex is generated. The vacuum vortex flows out of the vortex hole 50212 and then passes through the first hole 5021, thus increasing the kinetic energy. Therefore, the substrate 9 is adsorbed by a stable adsorption force, and the adsorption force will not damage the substrate 9, thus prolonging the service life of the substrate 9, without causing an adsorption mark on the surface of the substrate 9.

Figure 12:
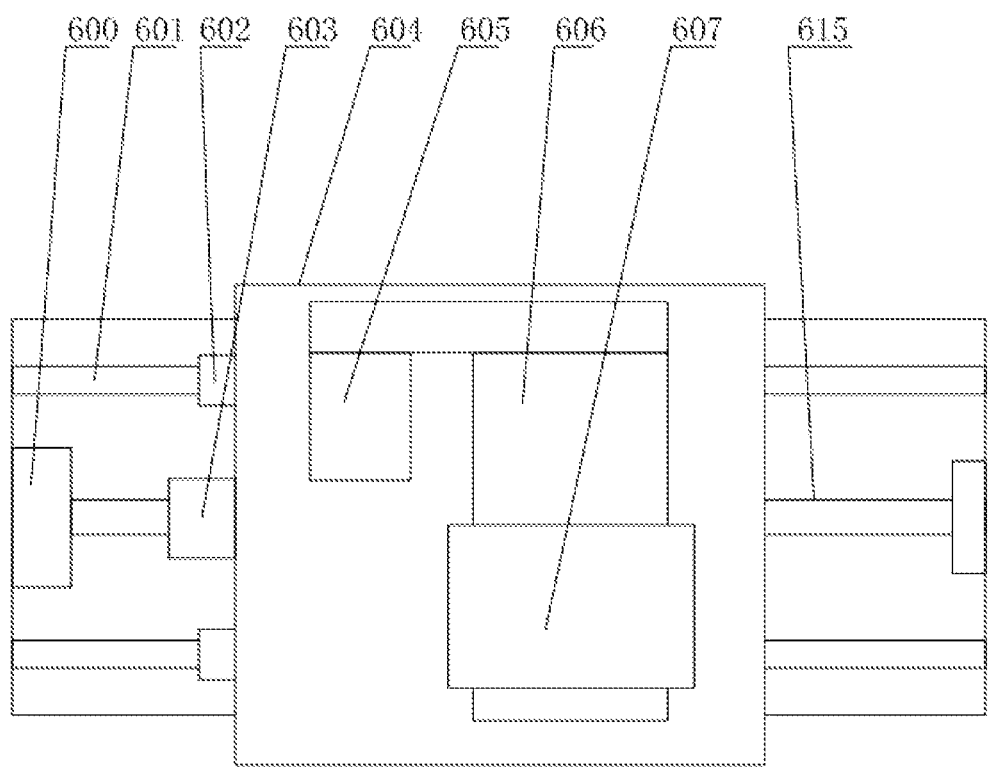
FIG. 12 is a first partial structural diagram of a pressing module of the hot-pressing device for an ACF bonding structure according to an embodiment of the present disclosure.
Figure 13:
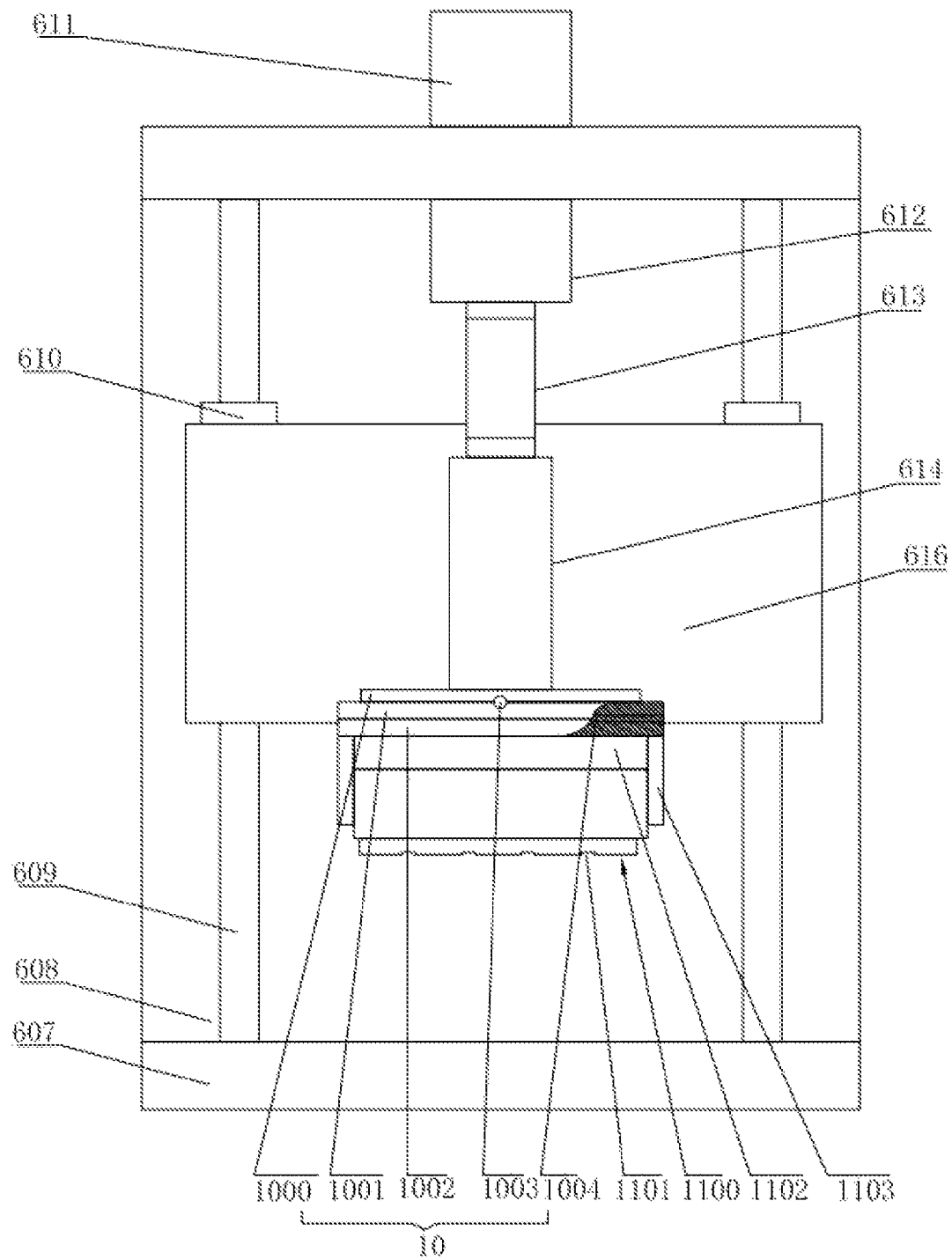
FIG. 13 is a second partial structural diagram of the pressing module of the hot-pressing device for an ACF bonding structure according to an embodiment of the present disclosure.

Referring to FIGS. 1, 12, and 13, the specific structure of the pressing module 6 is described below.

The pressing module can move independently in the X-direction, Y-direction, and Z-direction. In the pressing module, an X-direction moving assembly includes second driving element 600. The second driving element 600 is preferably a servo motor. The second driving element 600 is connected to second screw rod 615. The second screw rod 615 is threaded onto second nut 603. The second nut 603 is connected to second moving plate 604. To ensure the movement stability of the second moving plate 604, the bottom of the second moving plate 604 is connected to a pair of sixth sliders 602. Each sixth slider 602 is slidably connected to sixth guide rail 601. The sixth guide rail 601 is provided on a fixed bottom plate.

Further, a Y-direction moving assembly includes third driving element 605 mounted on second moving plate 604. The output end of the third driving element 605 is connected to linear module 606. The third driving element 605 is preferably a stepping motor. The linear module 606 is mainly a synchronous belt module, which mainly includes two synchronous wheels and a synchronous belt connected between the two synchronous wheels. The shaft end of one synchronous wheel is connected to the stepping motor. Fixing plate 607 is connected to the synchronous belt, and the synchronous belt moves to drive the fixing plate 607 to move. The linear module 606 belongs to the prior art and will not be described herein.

Further, referring to FIG. 13, a Z-direction moving assembly includes second mounting plate 608 vertically connected to the fixing plate 607. The second mounting plate 608 is provided with a pair of seventh guide rails 609. Each seventh guide rail 609 is provided with seventh slider 610. The seventh slider 610 is connected to third moving plate 616. The top of the second mounting plate 608 is further provided with fourth driving element 611. The fourth driving element 611 is preferably a cylinder. The output end of the fourth driving element 611 is connected to transition plate 613 through floating joint 612. The lower end of the transition plate 613 is connected to one part of leveling assembly 10 through punch 614, and the other part of the leveling assembly 10 is connected to the hot-pressing assembly.

Referring to FIG. 13, the leveling assembly 10 includes first plate 1000 and second plate 1001 connected to the first plate 1000. The second plate 1001 is connected to third plate 1002. A first balancing element is connected between the first plate 1000 and the second plate 1001. A second balancing element is connected between the second plate 1001 and the third plate 1002.

Referring to FIG. 13, the first balancing element is first shaft 1003 provided along a short-side direction of the first plate 1000, and the second balancing element is second shaft 1004 provided along a long-side direction of the third plate 1002. A lower surface of the first plate 1000 and an upper surface of the second plate 1001 are respectively provided with semicircular shaft mounting holes. The lower surface of the second plate 1001 and the upper surface of the third plate 1002 are respectively provided with semicircular shaft mounting holes. The second shaft 1004 and the first shaft 1003 are inserted into the shaft mounting holes.

Referring to FIG. 13, the first shaft 1003 ensures the flatness of the first plate 1000 and the second plate 1001 in a left-right direction, and the second shaft 1004 ensures the flatness of the second plate 1001 and the third plate 1002 in a front-back direction. In this way, the flatness and parallelism of the pressing part of the hot-pressing assembly are consistent, and the stress on the surface of the ACF is balanced after contacting the hot-pressing assembly to avoid indentation during the hot-pressing process and effectively solve the problem of flatness variation of the bonding structure when the temperature changes from low to high.

Figure 14:
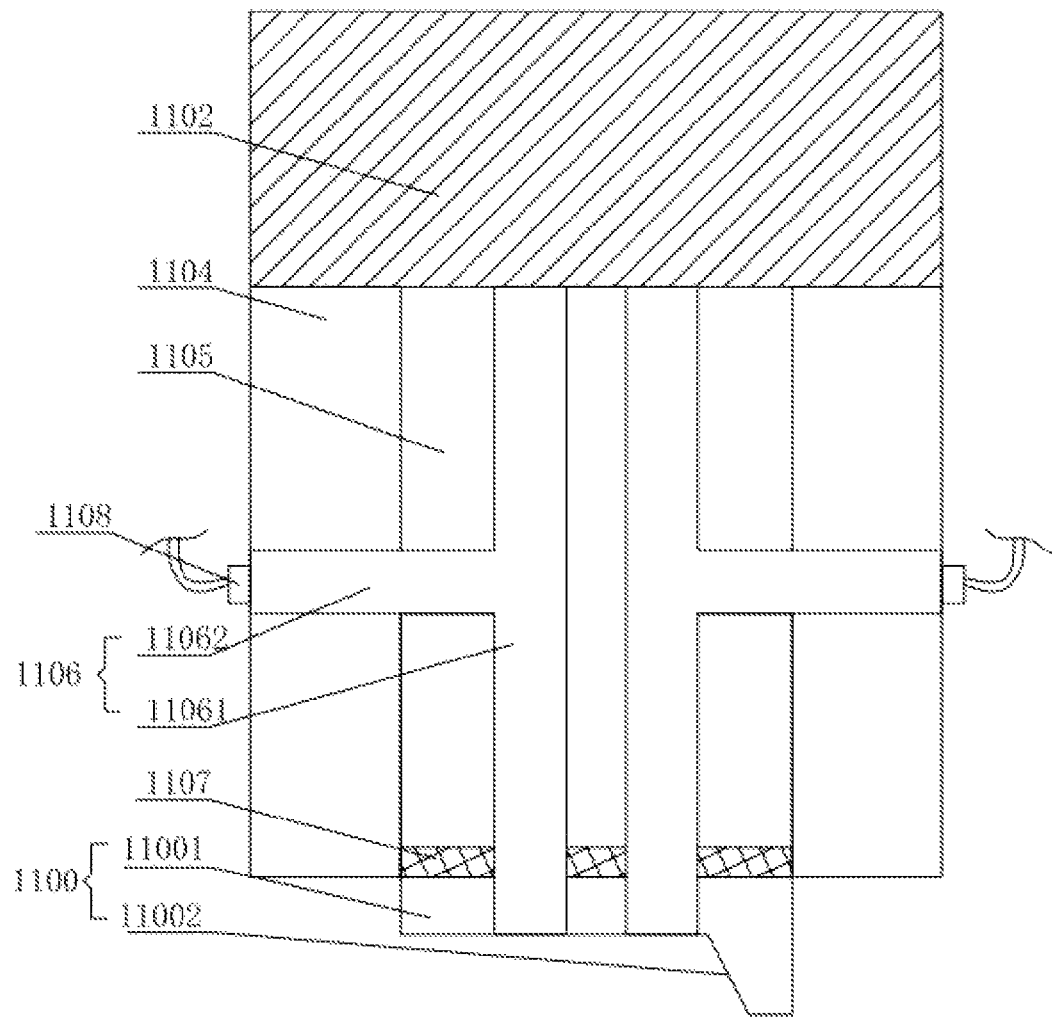
FIG. 14 is a structural diagram of a hot-pressing assembly of the hot-pressing device for an ACF bonding structure according to an embodiment of the present disclosure.
Figure 15:
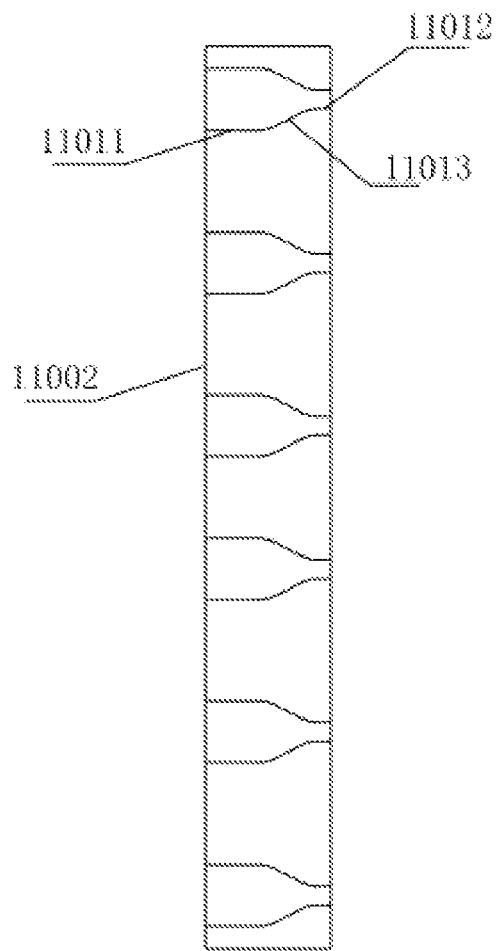
FIG. 15 is a partial structural diagram of the hot-pressing assembly of the hot-pressing device for an ACF bonding structure according to an embodiment of the present disclosure.

Referring to FIGS. 13, 14, and 15, the specific structure of the hot-pressing assembly is described in detail below.

The hot-pressing assembly includes a heat insulation part with an opening. The heat insulation part is a rectangular structure with an opening, which is enclosed by first heat insulation element 1102, two second heat insulation elements 1103, and two third heat insulation elements 1104. The first heat insulation element 1102 is connected to the third plate 1002. The rectangular structure with an opening is hollow inside, and the opening is closed by the heat conduction element 1100. Therefore, the hollow interior of the rectangular structure forms an enclosed space filled with heating element 1105. The heating element 1105 is preferably made of SUS440C, that is, martensitic stainless steel, with good high-temperature stability. At least one heating tube 1106 is provided in the heating element 1105. The heating tube 1106 is covered with multiple heating wires for electric heating. The heating tube 1106 has one part connected to the heat insulation part and the other part connected to the heating element 1105. The heating tube 1106 is further internally connected to thermocouple 1108. The thermocouple 1108 is configured to measure the temperature of the heating tube 1106.

The first heat insulation element 1102, the second heat insulation elements 1103, and the third heat insulation elements 1104 further inhibit the upward heat conduction of the heating element 1105 and the heating tube 1106, thus avoiding heat loss. The heat always flows downward and towards the heat conduction element 1100, such that the heat of the heat conduction element 1100 is always kept within a reasonable range.

Further, the heating tube 1106 is symmetrical with the central axis of the heating element 1105. The heating tube 1106 includes vertical first tube 11061 and horizontal second tube 11062 connected to the first tube 11061. The first tube 11061 has one end extending to the upper surface of the heating element 1105 and the other end extending to the lower surface of the heating element 1105. The second tube 11062 extends to a side of the heating element 1105. Most part of the heating element 1105 is covered by the heating tube 1106, which ensures the heat conduction performance of the heating element 1105 and the heating tube 1106, such that heat can be quickly and stably transferred to the heat conduction element 1100.

Further, a connection between the heating element 1105 and the heat conduction element 1100 is further connected to thermal conductive silica gel film 1107. The thermal conductive silica gel film 1107 can improve the heat transfer efficiency and play the role of shock absorption, insulation, etc. In addition, the thermal conductive silica gel film 1107 has a lower hardness, which increases the effective contact area of the thermal conductive silica gel film 1107, thus reducing the loss of heat conduction.

Further, referring to FIGS. 13, 14, and 15, in this embodiment, the heat conduction element 1100 is preferably made of a thermally conductive ceramic. The heat conduction element 1100 includes first part 11001 and second part 11002 connected to the first part 11001. The first part 11001 is provided with a hole for assembling the heating tube 1106. The second part 11002 extends in a vertical direction, and multiple grooves 1101 are arranged on the surface of the second part 11002.

Further, referring to FIGS. 13, 14, and 15, the groove 1101 has first notch 11011 and second notch 11012 connected to the first notch. Tapered transition port 11013 is provided between the first notch 11011 and the second notch 11012. The width of the first notch 11011 is greater than that of the second notch 11012. Through the first notch 11011 with a larger width, local normal-temperature gas below the temperature of the heat conduction element 1100 collects at the first notch 11011 during downward hot-pressing. During further downward hot-pressing, the gas is accelerated at the tapered transition port 11013 and enters the second notch 11012. The second notch 11012 with a smaller width contributes to the largest gas flow and the lowest temperature. In this way, the gas is further cooled as a cooling gas to impact the surface of the part to be hot-pressed. It generates heat exchange with the surface of the part to be hot-pressed to generate a temperature gradient, further releasing local stress and avoiding thermal stress deformation on the bonding structure during hot-pressing, thus improving the product yield.

Further, the groove 1101 can also play the role of yielding and enabling point pressure contact for the bottom contact surface of the second part 11002. In addition, the groove 1101 can further release local stress to avoid thermal stress deformation on the bonding structure during hot-pressing, thus improving the product yield.

Correspondingly, the present disclosure further provides a hot-pressing process by the hot-pressing device for an ACF bonding structure, which includes the following steps.

S1. The substrate is flattened through an unwinding mechanism. The operation adopts a prior art and a magnetic powder brake. An output end of the magnetic powder brake is connected to a tensioning wheel. The tensioning wheel is connected to an unwinding roller through a connecting rod. The unwinding roller evenly pulls the coiled substrate from a material tray with a certain tension. The unwinding mechanism is further provided with multiple other rollers, which contact with the substrate and ensure the flatness of the substrate pulled out. After the substrate is flattened, it is conveyed to the next station.

S2. A charge-coupled device (CCD) camera carries out visual scanning on the surface of the flattened substrate and acquires positioning coordinates of the surface of the substrate through a computer program for pre-pressing.

S3. The ACF is pre-pressed on the surface of the substrate according to the positioning coordinates. A pre-pressing module of a prior art is used to prepress the ACF. Specifically, the pre-pressing module is connected to the punch through the output end of the servo motor and performs the pre-pressing along the Z-direction. The pre-pressing module is further used to take out the ACF and pre-press the ACF at the corresponding positioning coordinates after calibration by the CCD camera.

S4. Positioning is performed. The negative-pressure adsorption module is positioned by at least two positioning modules.

Specifically, referring to FIGS. 1, 2, and 3, each fourth cylinder body 400 is started, and the fourth piston 403 extends. The fourth piston 403 drives the fourth piston mounting plate 404 to extend, thus enabling the fifth slider 402 to slide along the fifth guide rail 401. When the fourth piston mounting plate 404 extends, it drives the positioning plate 405 to extend. The two positioning plates 405 are perpendicular to each other, such that the long sides and short sides of the adsorption plate 501 in the negative-pressure adsorption module 5 respectively lean against the two positioning plates 405 to form reference positioning.

Figure 5:
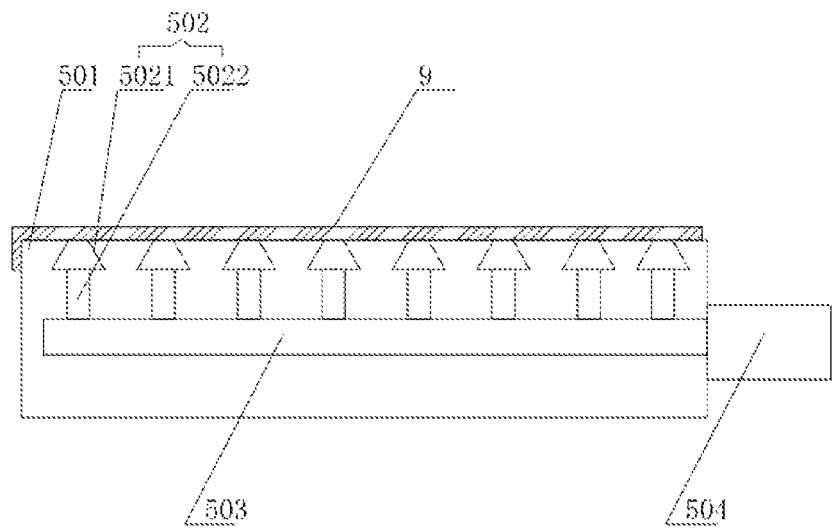
FIG. 5 is a structural diagram of a negative-pressure adsorption module of the hot-pressing device for an ACF bonding structure according to an embodiment of the present disclosure.
Figure 6:
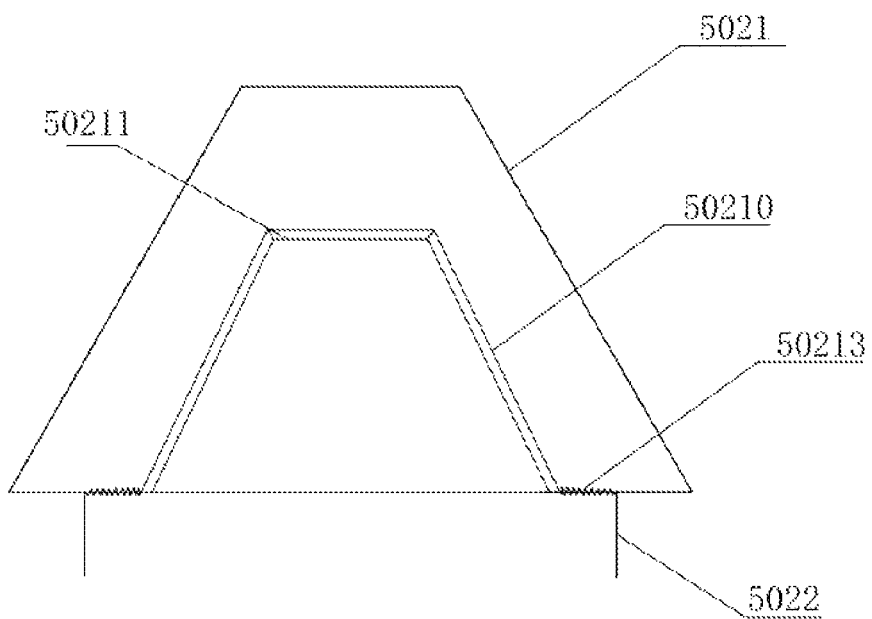
FIG. 6 is a structural diagram of a first hole in the negative-pressure adsorption module of the hot-pressing device for an ACF bonding structure according to an embodiment of the present disclosure.
Figure 7:
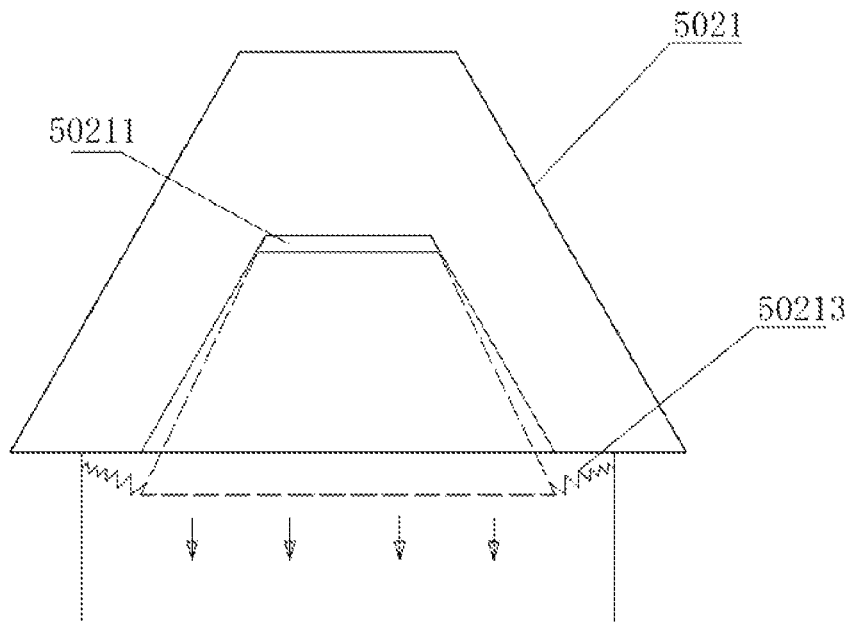
FIG. 7 is a schematic diagram of an operation of an airflow tube in the negative-pressure adsorption module of the hot-pressing device for an ACF bonding structure according to an embodiment of the present disclosure.
Figure 8:
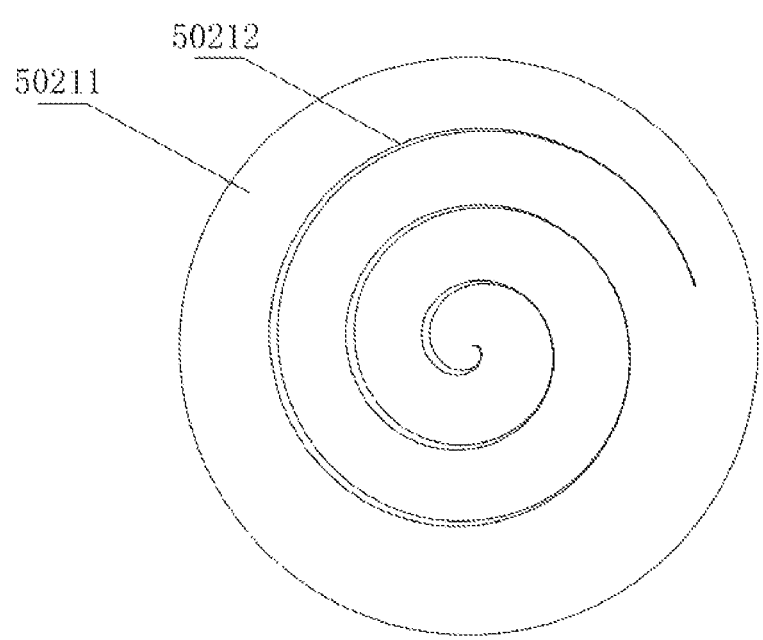
FIG. 8 is a structural diagram of a spacer of the hot-pressing device for an ACF bonding structure according to an embodiment of the present disclosure.

S5. The substrate 9 is placed on the surface of the adsorption plate 501. Referring to FIG. 5, the substrate 9 has a bent part and is butted with one side of the adsorption plate 501. The vacuum generating device 504 is pneumatically operated to provide an adsorption force for each vacuum adsorption hole 502 to adsorb the substrate 9. The ACF is pre-pressed on the surface of the substrate 9 through an external pre-pressing device.

S6. The lifting module partially covers the surface of the substrate through the pressing plate 8. Specifically, referring to FIG. 11, the third cylinder body 300 in the lifting module 3 is started, and the third piston 303 extends. The third piston 303 goes downward and drives the third piston connecting plate 304, the pressing plate mounting plate 305, and the pressing plate 8 to extend downward until the pressing plate 8 contacts the surface of the substrate, thus covering the substrate 9.

S7. Hot-pressing is performed. Referring to FIG. 12, before hot-pressing is performed, the second driving element 600 controls the second screw rod 615 to rotate, thus driving the second nut 603 and the second moving plate 604 to move, such that the second moving plate 604 moves in the X-direction. The third driving element 605 controls the linear module 606 to drive the fixing plate 607 to move in the Y-direction. The fourth driving element 611 is started, and the fourth driving element 611 drives the punch 614 downward through the floating joint 612, such that the hot-pressing assembly goes downward as a whole. Before the hot-pressing assembly goes downward, the heat of the heating wire in the heating tube 1106 is released. The heat of the heating tube 1106 accumulates in the heating element 1105 and is completely transferred to the heat conduction element 1100 through the thermal conductive silica gel film 1107. The heat conduction temperature of the heat conduction element 1100 is preferably 250° C. The force required for each square millimeter of the ACF is about 0.3 N. That is, the pre-pressing force of the second driving element 600 is controlled to be 200 N. After the heat conduction element 110 contacts the ACF, the ACF is pressed for 5 s. Then the second driving element 611 is lifted, and the ACF is bonded with the substrate.

S8. The fourth driving element 611 controls the punch 614 to reset upward, such that the hot-pressing assembly is raised upward. After the hot-pressing assembly is raised to a designated position, the transfer module 1 starts working. The first driving element 103 drives the first screw rod 104 to drive the first nut 105 to move, such that the first moving plate 106 drives the lifting module 3, the positioning module 4, and the first mounting plate 2 away from the pressing module 6.

S9. Referring to FIGS. 9 and 10, the first cylinder body 700 is started and drives the first piston connecting plate 703 upward through the first piston 702. The first piston connecting plate 703 goes upward and drives the water storage base 720, the non-woven fabric 715, and the sandpaper 713 upward to a designated position. Then the first cylinder body 700 is stopped. The fourth driving element 611 controls the punch 614 to move downward, such that the hot-pressing assembly moves downward. During the downward movement, the second moving plate 604 is controlled to adjust a position in the X-direction through the second driving element 600, the second screw rod 615, and the second nut 603. The third driving element 605 and the linear module 606 control the fixing plate 607 to adjust a position in the Y-direction. In this way, the hot-pressing assembly moves directly above the sandpaper 713. The fourth driving element 611 controls the heat conduction element 1100 to go downward, such that the second part 11002 of the heat conduction element 1100 contacts the sandpaper 713. The third driving element 605 and the linear module 606 control the fixing plate 607 to move back and forth in the Y-direction, thus rubbing the surface of the second part 11002 with the sandpaper 713. The rubbing is carried out times, 5 s each time to remove part of overflown glue that can be easily removed and leave part of the overflown glue that is hard to remove. The fourth driving element 611 controls the punch 614 to move upward and reset, such that the hot-pressing assembly is raised upward. The second moving plate 604 and the whole hot-pressing assembly are controlled to move close to the non-woven fabric 715 through the second driving element 600, the second screw rod 615, and the second nut 603. The fourth driving element 611 controls the punch 614 to move downward, such that the hot-pressing assembly moves downward. The second part 11002 of the heat conduction element 1100 contacts the surface of the non-woven fabric 715. The fixing plate 607 is controlled to move back and forth repeatedly in the Y-direction by the third driving element 605 and the linear module 606. The surface of the second part 11002 contacts the surface of the non-woven fabric 715 to wet the glue on the surface of the second part 11002. The second part 11002 contacts the non-woven fabric 715 repeatedly 5 times, and the wetting time for each contact is 5 s. The action is repeated to move the wet second part 11002 to contact and rub with the sandpaper 713 at least 2 times to remove all the glue. By removing the glue on the surface of the second part 11002, the stability of the second part 11002 of the heat conduction element 1100 during hot-pressing is ensured.

During the removal process, the suction valve 710 can also be opened to remove dust and other small impurities adsorbed on the second part 11002.

In other embodiments of the present disclosure, the ACF can also be a thermosetting composite conductive film. The hot-pressing process of the thermosetting composite conductive film is the same as that of the ACF and will not be repeated herein.

The technical features of the foregoing embodiments can be employed in arbitrary combinations. For brevity of description, not all possible combinations of the technical features of the foregoing embodiments are described. However, the combinations of the technical features should be construed as falling within the scope described in this specification as long as there is no contradiction in the combinations.

Only several embodiments of the present disclosure are described in detail above, but they should not, therefore, be construed as limiting the scope of the present disclosure. It should be noted that those of ordinary skill in the art can further make several variations and improvements without departing from the concept of the present disclosure, and all of these fall within the protection scope of the present disclosure. Therefore, the protection scope of the present disclosure shall be subject to the protection scope defined by the claims.

What is claimed is:

1. A hot-pressing device for an anisotropic conductive film (ACF) bonding structure, comprising a transfer module and a first mounting plate connected to the transfer module, wherein a negative-pressure adsorption module, at least one positioning module, and a lifting module are arranged on the first mounting plate; pressing modules with hot-pressing assemblies are arranged at four corners close to the first mounting plate; and cleaning modules corresponding to the pressing modules are arranged in the transfer module below the first mounting plate; and the cleaning modules each comprise a first linear guide rail; a first part of a movable end of the first linear guide rail is connected to a water storage base; the water storage base is provided with at least one water storage tank, a water-absorbing element is provided in the at least one water storage tank; the water-absorbing element is provided below a non-woven fabric fixed by a pressure base; an abrasive element close to one side of the pressure base is provided at a movable end of a second linear guide rail; the second linear guide rail is provided at a second part of the movable end of the first linear guide rail; the movable end of the second linear guide rail is further provided with a valve mounting plate; and the valve mounting plate is provided with a suction hole, the suction hole is connected to a suction valve.

2. The hot-pressing device for the ACF bonding structure according to claim 1, wherein the negative-pressure adsorption module is configured to adsorb a substrate and comprises an adsorption plate and multiple vacuum adsorption holes arranged in the adsorption plate; the vacuum adsorption holes are connected to a vacuum generating device through a vacuum channel and each comprise a first hole and a second hole communicated with the first hole; a diameter of the first hole decreases towards a surface of the adsorption plate; the first hole is provided therein with an airflow tube, a first end of the airflow tube is connected to a wall of the second hole through at least two elastic elements and a second end of the airflow tube is connected to a spacer; and the spacer has a vortex hole.

3. The hot-pressing device for the ACF bonding structure according to claim 1, wherein the transfer module comprises a first moving plate connected to the first mounting plate; the first moving plate is connected to a first part of a third linear guide rail, a second part of the third linear guide rail is connected to a bottom plate; and the first moving plate is further connected to an output end of a first driving element through a first transmission mechanism.

4. The hot-pressing device for the ACF bonding structure according to claim 1, wherein the lifting module comprises a first cylinder body and a first piston connecting plate connected to the first cylinder body; the first piston connecting plate is connected to a first part of a fourth linear guide rail, a second part of the fourth linear guide rail is provided in the first cylinder body; and an outer side of the first piston connecting plate is connected to a pressing plate mounting plate, the pressing plate mounting plate is connected to a pressing plate.

5. The hot-pressing device for the ACF bonding structure according to claim 1, wherein the positioning module comprises a second cylinder body; an output end of the second cylinder body is connected to a first part of a fifth linear guide rail, a second part of the fifth linear guide rail is provided in the second cylinder body; and the first part of the fifth linear guide rail is further connected to a positioning plate.

6. The hot-pressing device for the ACF bonding structure according to claim 1, wherein the pressing modules each comprise a second driving element, an output end of the second driving element is connected to a second moving plate through a second transmission mechanism; a bottom of the second moving plate is connected to a sixth linear guide rail; the second moving plate is further provided with a third driving element and a linear module connected to an output end of the third driving element; the linear module is provided with a fixing plate, the fixing plate is connected to a second mounting plate; the second mounting plate is provided with a seventh linear guide rail and a third moving plate connected to one part of the seventh linear guide rail; one part of a transition plate is connected to the third moving plate; the transition plate has a first end connected to a fourth driving element through a floating joint and a second end connected to a first part of a leveling assembly through a punch; and a second part of the leveling assembly is connected to the hot-pressing assembly.

7. The hot-pressing device for the ACF bonding structure according to claim 6, wherein
the hot-pressing assembly comprises a heat insulation part with an opening; the opening of the heat insulation part is closed by a heat conduction element; an enclosed space is formed between an inner side of the heat insulation part and an inner side of the heat conduction element, a heating element is provided in the closed space; the heating element is provided therein with at least one heating tube; the at least one heating tube has a first part connected to the heat insulation part and a second part connected to the heating element; an interior of the at least one heating tube is further connected to a thermocouple; and a thermal conductive silica gel film is provided at a connection between the heating element and the heat conduction element.

8. The hot-pressing device for the ACF bonding structure according to claim 7, wherein
the heat conduction element comprises a first part and a second part integrally connected to the first part; the second part protrudes outward from a side of the first part; a surface of the second part is provided with at least one groove, the at least one groove comprises a first notch and a second notch; the first notch has a width larger than a width of the second notch; and a tapered transition port is provided between the first notch and the second notch.

9. A hot-pressing process by the hot-pressing device for the ACF bonding structure according to claim 1, comprising the following steps:
flattening a substrate by an unwinding mechanism and conveying the substrate;
performing a visual scanning on a surface of a flattened substrate and acquiring positioning coordinates for pre-pressing;

pre-pressing an ACF at the positioning coordinates on the surface of the flattened substrate;

positioning the negative-pressure adsorption module by at least two positioning modules;

adsorbing the substrate by the negative-pressure adsorption module;

locally covering the surface of the flattened substrate with a pressing plate by the lifting module;

moving at least one pressing module and lowering the hot-pressing assembly to the surface of the flattened substrate to hot-press the ACF;

resetting the hot-pressing assembly, moving, by the transfer module, the negative-pressure adsorption module, the substrate, the at least two positioning modules, and the lifting module away from the at least one pressing module through the first mounting plate;

raising the cleaning module, controlling, by the at least one pressing module, one part of the hot-pressing assembly to rub with an abrasive part of the cleaning module at least 5 times, 1-5 s each time, controlling, by the at least one pressing module, the hot-pressing assembly to move to a wet part of the cleaning module, such that the one part of the hot-pressing assembly is wetted at least 5 times, 2-5 s each time, and controlling, by the at least one pressing module, the one part of the hot-pressing assembly to rub with the abrasive part of the cleaning module at least 2 times.

10. The hot-pressing process by the hot-pressing device for the ACF bonding structure according to claim 9, wherein alternatively, the ACF is replaced with a thermosetting composite conductive film.

11. The hot-pressing process by the hot-pressing device for the ACF bonding structure according to claim 9, wherein the negative-pressure adsorption module is configured to adsorb the substrate and comprises an adsorption plate and multiple vacuum adsorption holes arranged in the adsorption plate; the vacuum adsorption holes are connected to a vacuum generating device through a vacuum channel and each comprise a first hole and a second hole communicated with the first hole; a diameter of the first hole decreases towards a surface of the adsorption plate; the first hole is provided therein with an airflow tube, a first end of the airflow tube is connected to a wall of the second hole through at least two elastic elements and a second end of the airflow tube is connected to a spacer; and the spacer has a vortex hole.

12. The hot-pressing process by the hot-pressing device for the ACF bonding structure according to claim 9, wherein the transfer module comprises a first moving plate connected to the first mounting plate; the first moving plate is connected to a first part of a third linear guide rail, a second part of the third linear guide rail is connected to a bottom plate; and the first moving plate is further connected to an output end of a first driving element through a first transmission mechanism.

13. The hot-pressing process by the hot-pressing device for the ACF bonding structure according to claim 9, wherein the lifting module comprises a first cylinder body and a first piston connecting plate connected to the first cylinder body; the first piston connecting plate is connected to a first part of a fourth linear guide rail, a second part of the fourth linear guide rail is provided in the first cylinder body; and an outer side of the first piston connecting plate is connected to a pressing plate mounting plate, the pressing plate mounting plate is connected to the pressing plate.

14. The hot-pressing process by the hot-pressing device for the ACF bonding structure according to claim 9, wherein the positioning module comprises a second cylinder body; an output end of the second cylinder body is connected to a first part of a fifth linear guide rail, a second part of the fifth linear guide rail is provided in the second cylinder body; and the first part of the fifth linear guide rail is further connected to a positioning plate.

15. The hot-pressing process by the hot-pressing device for the ACF bonding structure according to claim 9, wherein the pressing modules each comprise a second driving element, an output end of the second driving element is connected to a second moving plate through a second transmission mechanism; a bottom of the second moving plate is connected to a sixth linear guide rail; the second moving plate is further provided with a third driving element and a linear module connected to an output end of the third driving element; the linear module is provided with a fixing plate, the fixing plate is connected to a second mounting plate; the second mounting plate is provided with a seventh linear guide rail and a third moving plate connected to one part of the seventh linear guide rail; one part of a transition plate is connected to the third moving plate; the transition plate has a first end connected to a fourth driving element through a floating joint and a second end connected to a first part of a leveling assembly through a punch; and a second part of the leveling assembly is connected to the hot-pressing assembly.

16. The hot-pressing process by the hot-pressing device for the ACF bonding structure according to claim 15, wherein the hot-pressing assembly comprises a heat insulation part with an opening; the opening of the heat insulation part is closed by a heat conduction element; an enclosed space is formed between an inner side of the heat insulation part and an inner side of the heat conduction element, a heating element is provided in the closed space; the heating element is provided therein with at least one heating tube; the at least one heating tube has a first part connected to the heat insulation part and a second part connected to the heating element; an interior of the at least one heating tube is further connected to a thermocouple; and a thermal conductive silica gel film is provided at a connection between the heating element and the heat conduction element.

* * * * *